(12) United States Patent
Song et al.

(10) Patent No.: US 11,295,938 B2
(45) Date of Patent: Apr. 5, 2022

(54) MULTI-RADIUS MAGNETRON FOR PHYSICAL VAPOR DEPOSITION (PVD) AND METHODS OF USE THEREOF

(71) Applicant: APPLIED MATERIALS, INC., Santa Clara, CA (US)

(72) Inventors: Jiao Song, Singapore (SG); Anthony Chih-Tung Chan, Sunnyvale, CA (US); David Gunther, Santa Clara, CA (US); Kirankumar Neelasandra Savandaiah, Bangalore (IN); Irena H. Wysok, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/916,494

(22) Filed: Jun. 30, 2020

(65) Prior Publication Data
US 2021/0407778 A1    Dec. 30, 2021

(51) Int. Cl.
*H01J 37/34* (2006.01)
*C23C 14/35* (2006.01)

(52) U.S. Cl.
CPC .......... *H01J 37/3455* (2013.01); *C23C 14/35* (2013.01); *H01J 37/3408* (2013.01); *H01J 2237/332* (2013.01)

(58) Field of Classification Search
CPC .. H01J 37/345; H01J 37/3452; H01J 37/3455; H01J 37/3458; H01J 37/3476; H01J 2237/332; C23C 14/35
USPC ........................................................ 204/298.2
See application file for complete search history.

(56) References Cited

U.S. PATENT DOCUMENTS

| | | | |
|---|---|---|---|
| 6,692,618 B2 * | 2/2004 | Dubs | C23C 14/35 204/192.12 |
| 6,852,202 B2 | 2/2005 | Miller et al. | |
| 7,736,473 B2 | 6/2010 | Miller et al. | |
| 8,721,847 B2 | 5/2014 | Chang et al. | |
| 2012/0152896 A1 * | 6/2012 | Zhou | H01J 37/3402 216/48 |
| 2014/0216923 A1 * | 8/2014 | Miller | H01J 37/3408 204/192.15 |

\* cited by examiner

*Primary Examiner* — Rodney G McDonald
(74) *Attorney, Agent, or Firm* — Moser Taboada

(57) ABSTRACT

Methods and apparatus for processing a substrate are provided herein. In embodiments, a magnetron assembly for use in a PVD chamber includes: a base plate having a first side, a second side opposite the first side, and a central axis; a magnet plate rotatably coupled to the base plate, wherein the magnet plate rotates with respect to the base plate about an offset axis; a magnet assembly coupled to the magnet plate offset from the offset axis and configured to rotate about the central axis and the offset axis; a first motor coupled to the base plate to rotate the magnet assembly about the central axis; and a second motor coupled to the magnet plate to control an angular position thereof and to position the magnet assembly in each of a plurality of fixed angular positions defining a plurality of different fixed radii.

20 Claims, 4 Drawing Sheets

MULTI-RADIUS MAGNETRON FOR PHYSICAL VAPOR DEPOSITION (PVD) AND METHODS OF USE THEREOF

FIELD

Embodiments of the present disclosure generally relate to substrate processing equipment.

BACKGROUND

Semiconductor devices are generally fabricated on a substrate as integrated circuits with various conductive layers that are interconnected to one another to facilitate propagation of signals within the device. In some instances, the devices are interconnected by vias or electrical connections that provide connections through different layers of the integrated circuits. Vias that are formed in silicon material are called through silicon vias or TSVs. As the complexity of the circuits increases, the size of the semiconductor structures decreases to allow more structures per given area. More and more layers are also incorporated to increase the density of the integrated circuits. The high density forces the TSVs to become smaller in diameter and at the same time the increase in the number of layers requires the depth of the TSVs to dramatically increase. The inventors have found that due to the small diameter sizes and the increased depth of the TSVs, barrier layer materials, such as copper or tantalum, are not sputtered uniformly on the sides and bottoms of the TSVs in physical vapor deposition (PVD) chambers.

Thus, the inventors have provided improved an improved PVD chamber to uniformly deposit materials on high aspect ratio TSV structures.

SUMMARY

Methods and apparatus for processing a substrate in a PVD chamber are provided herein. In some embodiments, a magnetron assembly for use in a PVD chamber includes: a base plate having a first side, a second side opposite the first side, and a central axis; a magnet plate rotatably coupled to the base plate on the first side of the base plate, wherein the magnet plate rotates with respect to the base plate about an offset axis; a magnet assembly coupled to the magnet plate offset from the offset axis and configured to rotate about the central axis and the offset axis; a first motor coupled to the base plate to rotate the magnet assembly about the central axis; and a second motor coupled to the magnet plate to control an angular position thereof and to position the magnet assembly in each of a plurality of fixed angular positions defining a plurality of different fixed radii, wherein the magnet assembly is configured to rotate 360 degrees about the central axis at each of the plurality of fixed radii.

In some embodiments, a method of depositing metallic film on a substrate includes: positioning a magnet assembly in a physical vapor deposition (PVD) chamber at a first fixed radius with respect to a central axis of a target; depositing metallic film onto the substrate disposed opposite the target in the PVD chamber while rotating the magnet assembly with respect to the central axis at the first fixed radius for a first period of time; positioning the magnet assembly at a second fixed radius with respect to the central axis by rotating the magnet assembly about an offset axis; and depositing metallic film onto the substrate while rotating the magnet assembly with respect to the central axis at the second fixed radius for a second period of time.

In some embodiments, a non-transitory computer readable medium for storing computer instructions that, when executed by at least one processor causes the at least one processor to perform a method including: positioning a magnet assembly in a physical vapor deposition (PVD) chamber at a first fixed radius with respect to a central axis of a target; depositing metallic film onto a substrate disposed opposite the target in the PVD chamber while rotating the magnet assembly with respect to the central axis at the first fixed radius for a first period of time; positioning the magnet assembly at a second fixed radius with respect to the central axis by rotating the magnet assembly about an offset axis; and depositing metallic film onto the substrate while rotating the magnet assembly with respect to the central axis at the second fixed radius for a second period of time Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
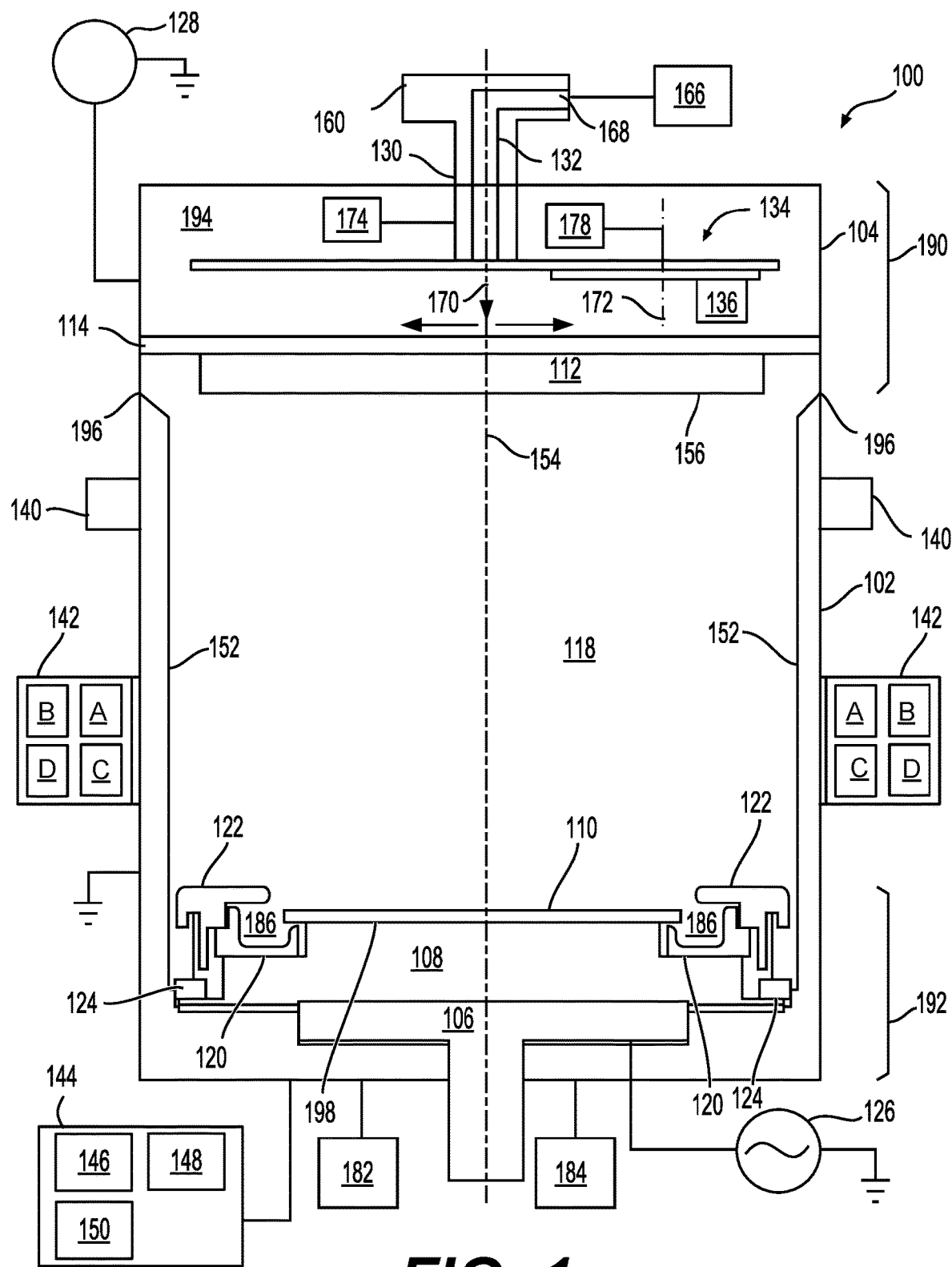
FIG. 1 depicts a schematic side view of a PVD chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for forming barrier layers in through silicon vias (TSVs) having high aspect ratio structure depositions with increased step coverage are provided herein. The apparatus provided herein comprises a physical deposition (PVD) chamber that includes a magnetron assembly having a smaller and stronger magnet assembly with additional electromagnet control for enhanced PVD copper coverage on TSV structures with enhanced film uniformity.

The magnet assembly used with the methods provided herein produces a high ionization fraction that advantageously results in better step coverage performance. A process recipe using the magnet assembly positioned at a plurality of radii from a central axis of magnetron assembly advantageously improves step coverage and film deposition rate. For example, the process recipe may include a five radius process recipe. The PVD chamber may also include both lower and upper electromagnets surrounding the chamber body. The additional upper electromagnets assist in guiding ions that normally would be lost on chamber shields towards the substrate to produce more ions on the substrate and better nonuniformity percentage (NU %) control.

As the classic Moore's law scaling slows, the semiconductor industry is looking towards new vertical scaling paradigms to drive improvements in power, performance, and cost. TSVs are an integral 3D Packaging enabler and scaling of TSV aspect ratios from 5×50 um to 3×50 um challenges PVD coverage and PVD's ability to achieve continuous barrier and seed layers on the TSVs. The smaller diameters and higher aspect ratios result in a need for thicker PVD films which increase cost and allow competition from alternative non-PVD metallization approaches. The PVD chamber of the present principles enables cost effective TSV metallization for next generation TSVs and enables larger market adoption of 3D packaging.

In some embodiments, the PVD chamber includes enhanced grounding for RF bias current return for more uniform depositions, a deposition ring with enhanced deposition control, and/or a magnetron assembly having a magnet assembly for increased deposition rate and coverage. In some embodiments, the PVD chamber includes higher DC power to improve coverage and deposition rate, higher RF bias to maintain a constant high ion energy, and/or source having a magnetron assembly with a center water feed to enable stable deposition rates as targets erode.

FIG. 1 is a cross-sectional view of a PVD chamber 100 according to some embodiments. The PVD chamber 100 may be used for the deposition of copper and other materials onto a substrate 110 which may contain semiconductor structures such as TSVs and the like. In some embodiments, the PVD chamber 100 may provide a deposition rate of about 80 angstroms per second to about 135 angstroms or greater using about 30 kW to about 50 kW of DC power and approximately 1.6 kW to 2.8 kW of RF bias power while achieving a less than approximately 5 percent sheet resistivity percentage (Rs) NU %. The PVD chamber 100 includes a chamber body 102 including a processing volume 118 disposed therein and a source 190 that includes a magnetron assembly 104 and a target 112. The substrate 110 is supported on substrate support assembly 192 that includes an electrostatic chuck (ESC) 108 which is supported by a substrate support pedestal 106. One or more gases may be supplied from a gas source 184 into a lower part of the PVD chamber 100. A pump 182 is connected to the PVD chamber 100 for exhausting the interior of the PVD chamber 100 and to facilitate maintaining a desired pressure inside the PVD chamber 100.

At the top of the processing volume 118, is the target 112 with a backing plate 114. The target 112 includes a sputtering surface 156 that faces the substrate 110. In some embodiments, the target 112 may be copper, titanium, tantalum, tungsten, or the like. A DC power source 128 provides DC power to the target 112 via the backing plate 114 to sputter the target 112 during processing. The backing plate 114 may comprise a conductive material, such as copper-zinc, copper-chrome, or the same material as the target 112, such that DC power can be coupled to the target 112 via the backing plate 114. Alternatively, the backing plate 114 may be non-conductive and may include conductive elements (not shown) such as electrical feedthroughs or the like. The backing plate 114 may be disc shaped, rectangular, square, or any other shape that may be accommodated by the PVD chamber 100. The backing plate 114 is configured to support the target 112 such that a front surface of the target 112 opposes the substrate 110 when present. The target 112 may be coupled to the backing plate 114 in any suitable manner. For example, in some embodiments, the target 112 may be diffusion bonded to the backing plate 114.

The magnetron assembly 104 includes a magnet assembly 136 that travels over the target 112 at a plurality of different fixed radii, or fixed positions, about a central axis 154. In some embodiments, the magnet assembly 136 may comprise a plurality of individual magnets. A support apparatus 134 supports the magnet assembly 136 and enables the magnet assembly 136 to rotate around the central axis 154. In some embodiments, a first motor 174 is coupled to the support apparatus 134 to rotate the magnet assembly 136 about the central axis 154. The magnet assembly 136 may rotate about an offset axis 172 that is offset from the magnet assembly 136 and offset from the central axis 154 to position the magnet assembly 136 at each of the plurality of different fixed radii. In some embodiments, a second motor 178 is coupled to the magnet assembly 136 to rotate the magnet assembly 136 about the offset axis 172 to control a radial position of the magnet assembly 136 with respect to the central axis 154. In some embodiments, the magnet assembly 136 is configured to rotate at least 180 degrees about the offset axis 172. In some embodiments, the magnet assembly 136 is configured to rotate about 180 degrees from a zero degree position about the offset axis 172 to position the magnet assembly 136 at each of the plurality of different fixed radii. The zero degree position may correspond with when the magnet assembly 136 is at a radially innermost position, or radially innermost radius. In some embodiments, the second motor 178 is configured to rotate the magnet assembly 136 independently of the first motor 174.

In some embodiments, unlike typical magnetron assemblies that are configured to rotate a magnet assembly in a planetary motion where a radius, or distance between the magnet assembly and a central axis, changes constantly, the magnetron assembly 104 is configured to position the magnet assembly 136 to a certain fixed radius with respect to the central axis (e.g., a first fixed radius) and then rotate the magnet assembly 136 about the central axis 154 at the fixed radius over a predetermined period of time (e.g., a first period of time). The magnet assembly 136 is subsequently positioned to a different fixed radius (e.g., a second fixed radius) and then rotated about the central axis 154 at the different fixed radius over a subsequent period of time (e.g., a second period of time). The repositioning of the magnet assembly 136 to set a different fixed radius and the rotation of the magnet assembly 136 at the different fixed radius for subsequent periods of time can be repeated as disclosed herein (e.g., to optionally provide a third fixed radius, a fourth fixed radius, a fifth fixed radius, etc.)

In some embodiments, the magnet assembly 136 is configured to rotate at five different radii about the central axis 154 of the base plate 202 and the magnet plate 204 is configured to rotate about the offset axis 172 to position the magnet assembly 136 at each of the five different radii. In some embodiments, a first fixed radius may be referred to as the radially innermost radius (e.g., the smallest possible radius) and a fifth fixed radius may be referred to as the outermost radius (e.g., the largest possible radius). In some embodiments, the first fixed radius is about 1.5 inches to about 2.6 inches. In some embodiments, the second fixed radius is about 2.6 inches to about 3.5 inches. In some embodiments, the third fixed radius is about 3.5 inches to about 4.5 inches. In some embodiments, the fourth fixed radius is about 4.5 inches to about 5.5 inches. In some embodiments, the fifth fixed radius is about 5.9 inches to about 7.5 inches.

In some embodiments, the source 190 of the PVD chamber 100 the source 190 uses a center coolant feed 132 to maximize the target life by alleviating cracking and/or bowing of the target due to overheating and decreases in the deposition rate over the life of the target. In some embodiments, conventionally supplied coolant feed structures supply coolant from a side of a cavity 194 of the magnetron assembly 104. However, because coolant flowing to the portion of the target 112 immediately beneath the magnet assembly 136 is obstructed by the magnet assembly 136, the portion of the target 112 immediately beneath the magnet assembly 136 does not receive a sufficient amount of coolant. As a result, as the magnetron assembly 104 rotates, the area within which the magnet assembly 136 moves over becomes excessively hot, sometimes reaching up to 400° C. A resulting temperature gradient is formed between portions of the target 112 that are sufficiently cooled and portions that are not sufficiently cooled. The temperature gradient leads to target cracking and/or bowing.

To keep the target 112 at a temperature less than about 200° C., the center coolant feed 132, which supplies coolant to a center of the target 112 (i.e., along the central axis 154. The center coolant feed 132 extends through a body portion 130 along the central axis 154. The center coolant feed 132 and includes a central channel 158 extending along the central axis 154 from a manifold portion 160 through a body portion 130. A coolant supply 166 is fluidly coupled to an inlet 168 of the manifold portion 160 to supply a coolant through the center coolant feed 132 and into the cavity 194. The center coolant feed 132 extends through the body portion 130 along the central axis 154 to supply a coolant (as shown by flow lines 170) to the cavity 194 at a center of the target 112. As a result, a more uniform flow of coolant is advantageously achieved, thus substantially reducing or eliminating the temperature gradient across the target 112, reducing cracking and bowing of the target. After entering the cavity 194 through the center coolant feed 132, the coolant subsequently flows out of the cavity 194 through an opening (not shown) formed in an outlet (not shown) disposed in a top of the cavity. A return line (not shown) is coupled to the outlet to receive the coolant after the coolant has flowed through the cavity 194.

An RF bias power source 126 may be coupled to the substrate support assembly 192 in order to induce a negative DC bias on the substrate 110. In addition, in some embodiments, a negative DC self-bias may form on the substrate 110 during processing. For example, RF energy supplied by the RF bias power source 126 may range in frequency from about 2 MHz to about 60 MHz, for example, non-limiting frequencies such as 2 MHz, 2.2 MHz, 13.56 MHz, or 60 MHz can be used. In some embodiments, the RF power may be supplied in a range from approximately 1.9 kW to about 3.0 kW. In some embodiments, the RF power supplied may change based on the distance, or radius, that the magnet assembly 136 is positioned with respect to the central axis 154. For example, at an outermost radius, the RF bias power supplied may be greater than RF bias power supplied at a radially innermost radius. In some embodiments, the RF bias power supplied may be about 2.0 MHz when the magnet assembly 136 is at a first fixed radius and a second fixed radius. In some embodiments, the RF bias power supplied may be about 2.2 MHz when the magnet assembly 136 is at a third fixed radius, a fourth fixed radius, and a fifth fixed radius.

In some embodiments, DC power may be supplied to the target 112 from a DC power source 128 in a range from approximately 30 kW to approximately 50 kW. In some embodiments, the DC power source 128 may provide DC power in range from approximately 36 kW to approximately 40 kW. In other applications, the substrate support assembly 192 may be grounded or left electrically floating.

The PVD chamber 100 further includes a process kit shield or shield 152 to surround the processing volume 118 of the PVD chamber 100 and to protect other chamber components from damage and/or contamination from processing. In some embodiments, the shield 152 may be grounded at an uppermost point 196 to the chamber body to provide an RF ground return path. The shield 152 extends downwardly and may include a generally tubular portion having a generally constant diameter that generally surrounds the processing volume 118. The shield 152 extends along the walls of the chamber body 102 downwardly to below an uppermost surface 198 of an ESC 108 and returns upwardly until reaching a cover ring 122 (e.g., forming a u-shaped portion at the bottom of the shield 152). The cover ring 122 rests on the top of an upwardly extending inner portion of the shield 152 when the substrate support assembly 192 is in a lower, loading position but rests on the outer periphery of a deposition ring 120 when in an upper, deposition position to protect the substrate support assembly 192 from sputter deposition. The deposition ring 120 may be used to protect the edges of the substrate support assembly 192 including substrate support pedestal and/or the ESC 108 from deposition around the edge of the substrate 110. In some embodiments, the deposition ring 120 has a large deposition cavity 186 that allows more deposition buildup before the deposition ring 120 needs to be replaced.

In some embodiments, a lower magnet assembly 142 may be disposed about the PVD chamber 100 for selectively providing a magnetic field between the ESC 108 and the target 112. For example, the lower magnet assembly 142 may be disposed about the exterior of the chamber body 102 in a region just above the ESC 108 when the substrate support assembly 192 is in a processing position. In some embodiments, an upper magnet assembly 140 may be disposed around and exterior to the chamber body 102 in closer proximity to the target 112 than the ESC 108 (above the lower magnet assembly 142 when present). The lower magnet assembly 142 and/or the upper magnet assembly 140 may be an electromagnet and may be coupled to a power source (not shown) for controlling the magnitude of the magnetic field generated by the electromagnet. The electromagnets produce magnetic B-fields that allow control of the ion direction and energies. The addition of the upper magnet assembly 140 allows for control of the ion direction and energies with higher accuracies than with the lower magnet assembly 142 alone. The higher accuracies allow for improvement in step coverage (deposition inside TSVs) of TSV structures.

The lower magnet assembly 142 and/or the upper magnet assembly 140 may be coupled to a coolant source (not shown) for controlling the temperature generated by operation of the electromagnet. In some embodiments, the upper magnet assembly 140 is supplied with about 6.0 amps to about 16.0 amps of current. In some embodiments, the lower magnet assembly 142 is supplied with about −18.0 amps to about 18.0 amps for a bottom inner magnet 142C. In some embodiments, the lower magnet assembly 142 is supplied with about −18.0 amps to about 18.0 amps for a top inner magnet 142A and a top outer magnet 142B. In some embodiments, a bottom outer magnet 142D is not used.

Substrate processing systems using RF generated plasmas, require a return path for RF currents generated during processing back to a source, such as the RF power source that supplied the current. In some cases, the return path may include the current traveling through a substrate support (e.g., ESC) along a floor of the processing system and then ultimately along a wall and/or shield of the processing system back to the source. When operating under certain processing conditions, arcing between chamber components, such as between the substrate support assembly 192 (including the ESC 108 and/or substrate support pedestal 106) and adjacent chamber components, and/or stray plasma can undesirably occur, leading to component damage and/or generation of particles that can further undesirably contaminate a substrate disposed in the chamber. Inside the processing volume 118, the process kit and shield 152 are grounded to the chamber body 102 and provide the main return for the plasma current. In some embodiments, the PVD chamber 100 may include one or more grounding loops 124 that electrically connect the substrate support assembly 192 (e.g., the ESC 108 and/or substrate support pedestal 106) to the shield 152.

A controller 144 may be provided and coupled to various components of the PVD chamber 100 to control the operation thereof. For example, the controller 144 may be configured to control a speed of rotation and position of the magnet assembly 136 during processing as well as a flow of current through the lower magnet assembly 142 and/or the upper magnet assembly 140. The controller 144 includes a central processing unit (CPU) 146, a memory 148, and support circuits 150. The controller 144 may control the PVD chamber 100 directly, or via computers (or controllers) associated with particular process chamber and/or support system components. The controller 144 may be one of any form of general-purpose computer processor that can be used in an industrial setting for controlling various chambers and sub-processors. The memory, or computer readable medium, 148 of the controller 144 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 150 are coupled to the CPU 146 for supporting the processor in a conventional manner. These circuits include cache, power supplies, clock circuits, input/output circuitry and subsystems, and the like. Methods to control the PVD chamber 100 and/or processes may be stored in the memory 148 as software routine that may be executed or invoked to control the operation of the PVD chamber 100 in the manner described herein. The software routine may also be stored and/or executed by a second CPU (not shown) that is remotely located from the hardware being controlled by the CPU 146.

Figure 2:
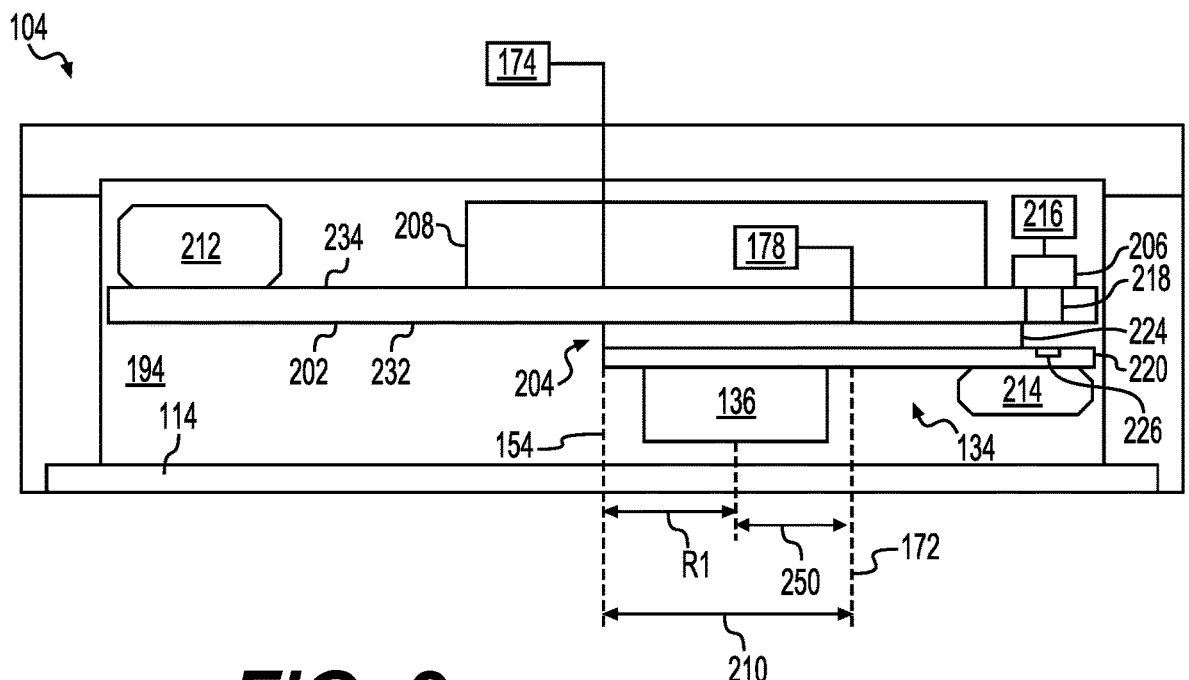
FIG. 2 depicts a schematic cross-sectional view of a magnetron assembly in accordance with some embodiments of the present disclosure.

FIG. 2 depicts a schematic cross-sectional view of a magnetron assembly 104 at a first fixed angular position having an innermost, e.g., smallest, fixed radius of the plurality of different fixed radii in accordance with some embodiments of the present disclosure. A first fixed radius R1 is defined as a distance between the central axis 154 and a center of the magnet assembly 136 when the magnet assembly 136 is at the first fixed angular position. In some embodiments, the first fixed radius R1 is about 1.5 inches to about 2.6 inches.

Figure 3A:
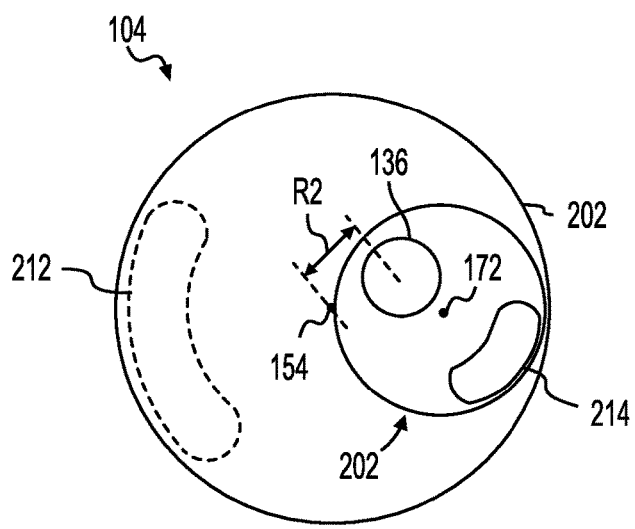
FIG. 3A depicts a schematic bottom view of the magnetron assembly in accordance with some embodiments of the present disclosure.

FIG. 3A depicts a schematic bottom view of a magnetron assembly 104 in accordance with some embodiments of the present disclosure. FIG. 3A depicts the magnet assembly 136 rotated from the first fixed angular position to a second fixed angular position. For example, in some embodiments the second fixed angular position may be set by rotating the magnet assembly 136 about the offset axis 172 by about 50 to about 70 degrees with respect to the first fixed radius R1, as depicted in FIG. 2. A second fixed radius R2 is defined as the distance between the central axis 154 and a center of the magnet assembly 136 when the magnet assembly 136 is in the second fixed angular position. In some embodiments, the second fixed radius R2 is about 1.5 inches to about 2.6 inches.

Figure 3B:
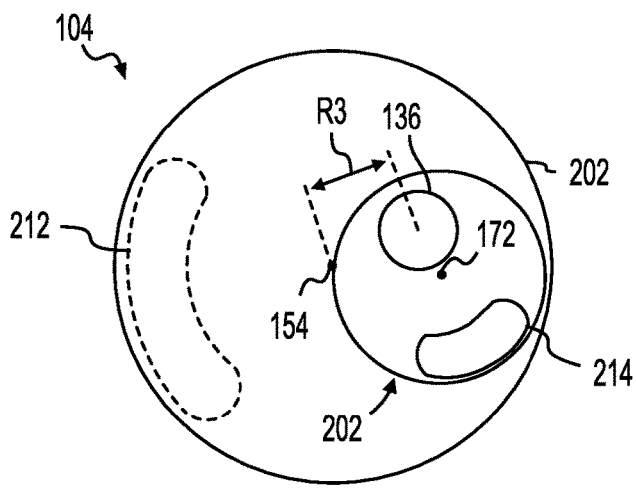
FIG. 3B depicts a schematic bottom view of the magnetron assembly in accordance with some embodiments of the present disclosure.

FIG. 3B depicts a schematic bottom view of a magnetron assembly 104 in accordance with some embodiments of the present disclosure. FIG. 3B depicts the magnet assembly 136 rotated from the second fixed angular position to a third fixed angular position. For example, in some embodiments, the third fixed angular position may be set by rotating the magnet assembly 136 about the offset axis 172 by about 60 to about 80 degrees with respect to the first fixed radius R1, as depicted in FIG. 2. A third fixed radius R3 is defined as a distance between the central axis 154 and a center of the magnet assembly 136 when the magnet assembly 136 is at the third fixed angular position. In some embodiments, the third fixed radius R3 is about 3.1 inches to about 3.3 inches.

Figure 3C:
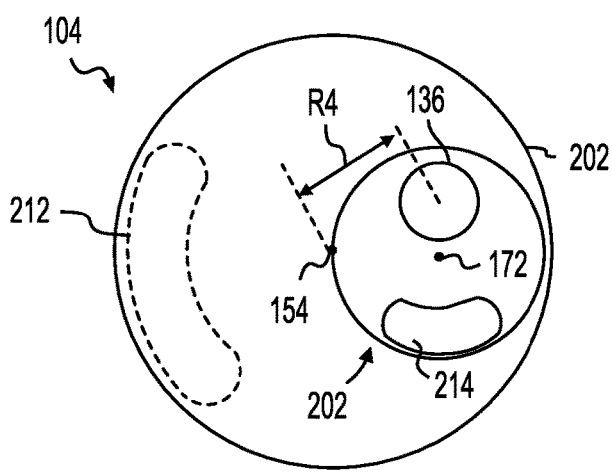
FIG. 3C depicts a schematic bottom view of the magnetron assembly in accordance with some embodiments of the present disclosure.
Figure 4:
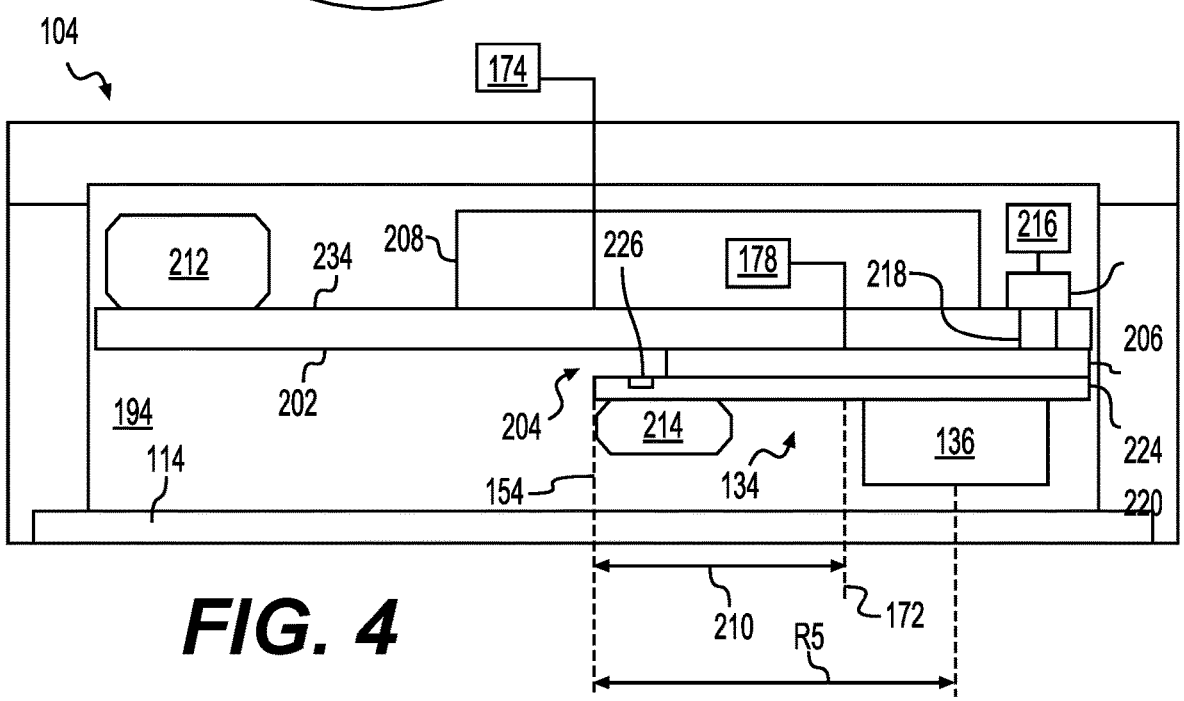
FIG. 4 depicts a schematic cross-sectional view of a magnetron assembly in accordance with some embodiments of the present disclosure.

FIG. 3C depicts a schematic bottom view of a magnetron assembly 104 in accordance with some embodiments of the present disclosure. FIG. 3A depicts the magnet assembly 136 rotated from the third fixed angular position to a fourth fixed angular position. For example, in some embodiments, the fourth fixed angular position may be set by rotating the magnet assembly 136 about the offset axis 172 by about 80 to about 90 degrees about the offset axis 172 with respect to the first fixed radius R1, as depicted in FIG. 2. A fourth fixed radius R4 is defined as a distance between the central axis 154 and a center of the magnet assembly 136 when the magnet assembly 136 is at the fourth fixed angular position. In some embodiments, the fourth fixed radius R4 is about 4.5 inches to about 5.5 inches FIG. 4 depicts the magnet assembly 136 rotated about 180 degrees about the offset axis 172 with respect to the first fixed radius R1, as depicted in FIG. 2. FIG. 4 shows the magnet assembly 136 positioned at the fifth fixed radius, or the radially outermost position, where the fifth fixed radius R5 is about 5.9 inches to about 7.5 inches. The magnet assembly 136 may be rotated about the offset axis 172 to position the magnet assembly 136 at the second fixed radius, the third fixed radius, and the fourth fixed radius.

Referring back to FIG. 2, in some embodiments, the support apparatus 134 of the magnetron assembly 104 includes a base plate 202 having a first side 232 and a second side 234 opposite the first side. The base plate 202 includes a central axis that coincides with the central axis 154 of the target. In some embodiments, the base plate 202 has a diameter greater than a diameter of the target 116. In some embodiments, the base plate 202 is generally a flat circular plate. In some embodiments, the support apparatus 134 includes a magnet plate 204 rotatably coupled to the base plate 202 on the first side 232 of the base plate 202. The offset axis 172 is generally centrally located on the magnet plate 204. In some embodiments, the magnet plate 204 does not extend over the central axis 154. In some embodiments, a distance 210 between the central axis 154 and the offset axis 172 is about 4.0 inches to about 5.0 inches. In some embodiments, a distance 250 between the offset axis 172 and a center of the magnetic assembly 136 is about 2.0 inches to about 3.0 inches.

In some embodiments, the magnetron assembly 104 includes a gearbox 208 to house one or more gears, shafts, of the like to facilitate rotation of the magnet assembly 136 about the central axis 154 and the offset axis 172. For example, the first motor 174 may be coupled to a shaft (not shown) to rotate the baseplate 202 (and the magnet assembly 136 coupled thereto) about the central axis 154. The second motor 178 may be coupled to a shaft (not shown) to rotate the magnet plate 204 (and the magnet assembly 136 coupled thereto) about the offset axis 172. The second motor 178 rotates the magnet plate 204 to control an angular position of the magnet assembly 136 and to position the magnet assembly 136 in each of a plurality of fixed angular positions (e.g., first fixed angular position, second fixed angular position, etc.) defining the plurality of different fixed radii. Once the magnet assembly 136 is positioned in each of the plurality of fixed angular positions, the second motor 178 stops rotation of the magnet plate 204 and the first motor 174 continues to rotate the baseplate 202 about the central axis 154 such that the magnet assembly 136 is configured to rotate 360 degrees about the central axis 154 at each of the plurality of different fixed radii.

In some embodiments, the base plate 202 includes a through hole 218 for a position sensor. A block 206 may be mounted to the second side 234 of the base plate 202 to support a position sensor 216. In some embodiments, the magnet plate 204 comprises a lower plate 220 coupled to an upper plate 224. The lower plate 220 is coupled to the magnet assembly 136 and the upper plate 224 is coupled to the base plate 202. In some embodiments, the upper plate 224 is sized smaller than the lower plate 220 or includes a cutout to expose a flag 226 disposed on or embedded within an upper surface of the lower plate 220. The flag 226 may be any component or material that can trigger the position sensor 216 when there is a line of sight between the position sensor 216 and the flag 226. For example, FIG. 2 depicts the magnet plate 204 positioned such that the flag 226 is aligned with the through hole 218 of the base plate 202, triggering to the position sensor 216 that the magnet assembly is at one of the plurality of different fixed radii, for example, the first fixed radius.

In some embodiments, the magnet assembly 136 is disposed about 180 degrees from the position sensor 216 with respect to the offset axis 172 when the magnet assembly is disposed at the first fixed radius. In some embodiments, the magnet assembly 136 is disposed about 0 degrees from the position sensor 216 with respect to the offset axis 172 when the magnet assembly is disposed at the fifth fixed radius.

In some embodiments, a first counterweight 212 is coupled to the base plate 202 opposite the magnet plate 204 about the central axis 154 to compensate for a weight of the magnet plate 204 and magnet assembly 136. In some embodiments, a second counterweight 214 is coupled to the magnet plate 204 on a side opposite the magnet assembly 136 about the offset axis 172 to compensate for a weight of the magnet assembly 136.

Figure 5:
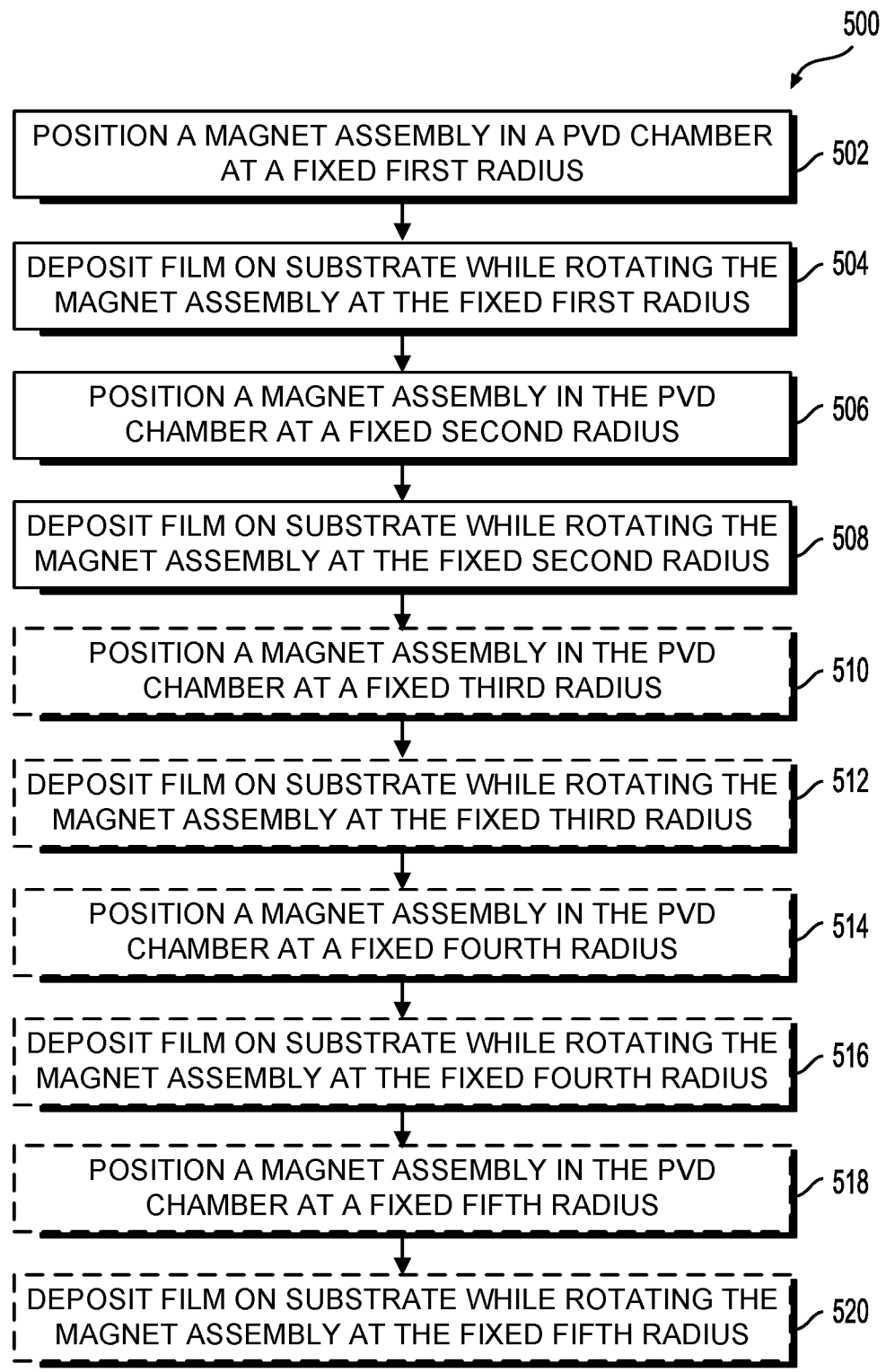
FIG. 5 depicts a flow chart of a method of depositing a metallic film on to a substrate in a PVD chamber in accordance with some embodiments of the present disclosure.

FIG. 5 depicts a flow chart of a method 500 of depositing a metallic film onto a substrate (e.g., substrate 110) in a PVD chamber in accordance with some embodiments of the present disclosure. In some embodiments, the metallic may comprise copper, titanium, tantalum, tungsten, or the like. In some embodiments, the method 500 comprises depositing metallic film on through silicon vias (TSV). A DC power source (e.g., DC power source 128) provides DC power to the target to sputter the target to deposit material onto the substrate. In some embodiments, the DC power source provides about 30 kW to about 50 kW of DC power. In some embodiments, the DC power source provides about 35 kW to about 40 kW of DC power.

At 502, the method 500 includes positioning a magnet assembly (e.g., magnet assembly 136) in a PVD chamber (e.g., PVD chamber 100) at a first fixed radius with respect to a central axis (e.g., central axis 154) of a target (e.g., target 112) by rotating the magnet assembly about an offset axis (e.g., offset axis 172). In some embodiments, the first fixed radius is about 1.5 inches to about 2.6 inches. In some embodiments, the first fixed radius is about 2.3 inches to about 2.5 inches.

At 504, the method 500 includes depositing metallic film onto a substrate disposed opposite the target in the PVD chamber while rotating the magnet assembly with respect to the central axis at the first fixed radius over a first period. In some embodiments, a rate of deposition of the metallic film onto the substrate while rotating the magnet assembly at the first fixed radius is about 85 to about 105 angstroms per second. In some embodiments, an RF bias power at a frequency of about 1.9 kW to about 2.1 kW is applied to a substrate support assembly (e.g., substrate support assembly 192) of the PVD chamber while depositing metallic film at the first fixed radius.

In some embodiments, an upper magnet assembly (e.g., upper magnet assembly 140) disposed about a chamber body of the PVD chamber is supplied with about 11.0 amps to about 15.0 amps of current while depositing metallic film at the first fixed radius. In some embodiments, a lower magnet assembly, (e.g., lower magnet assembly 142) disposed about the chamber body may include a top inner magnet (e.g., top inner magnet A), a top outer magnet (e.g., top outer magnet B), and a bottom inner magnet (e.g., bottom inner magnet C). In some embodiments, the top outer magnet, the top inner magnet are supplied with about negative 7.0 amps to about negative 1.0 amps of current while depositing metallic film at the first fixed radius. In some embodiments, the bottom inner magnet is supplied with about 7.0 amps to about 11.0 amps of current while depositing metallic film at the first fixed radius.

At 506, the method 500 includes positioning the magnet assembly at a second fixed radius with respect to the central axis by rotating the magnet assembly about the offset axis. In some embodiments, the second fixed radius is about 2.6 inches to about 3.5 inches. In some embodiments, the second fixed radius is about 3.1 inches to about 3.3 inches.

At 508, the method 500 includes depositing metallic film onto the substrate while rotating the magnet assembly with respect to the central axis at the second fixed radius over a second period of time. The second period of time may be the same as the first period of time or different than the first period of time. In some embodiments, a rate of deposition of the metallic film onto the substrate while rotating the magnet assembly at the second fixed radius is about 95 to about 115 angstroms per second. In some embodiments, an RF bias power at a frequency of about 1.9 kW to about 2.1 kW is applied to a substrate support assembly of the PVD chamber while depositing metallic film at the second fixed radius.

In some embodiments, the upper magnet assembly is supplied with about 13.0 amps to about 17.0 amps of current while depositing metallic film at the second fixed radius. In some embodiments, the top outer magnet and the top inner magnet are supplied with about negative 8.0 amps to about negative 12.0 amps of current while depositing metallic film at the second fixed radius. In some embodiments, the bottom inner magnet is supplied with about 8.0 amps to about 12.0 amps of current while depositing metallic film at the second fixed radius.

At 510, the method 500 includes positioning the magnet assembly at a third fixed radius with respect to the central axis by rotating the magnet assembly about the offset axis. In some embodiments, the third fixed radius is about 3.5 inches to about 4.5 inches. In some embodiments, the third fixed radius is about 4.1 inches to about 4.3 inches.

At 512, the method 500 includes depositing metallic film onto the substrate while rotating the magnet assembly with respect to the central axis at the third fixed radius over a third period of time. In some embodiments, the third period of time is similar to at least one of the first period of time or the second period of time. In some embodiments, the third period of time is different than each of the first period of time and the second period of time. In some embodiments, a rate of deposition of the metallic film onto the substrate while rotating the magnet assembly at the third fixed radius is about 75 to about 95 angstroms per second. In some embodiments, an RF bias power at a frequency of about 2.1 kW to about 2.3 kW is applied to a substrate support assembly of the PVD chamber while depositing metallic film at the third fixed radius.

In some embodiments, the upper magnet assembly is supplied with about 12.0 amps to about 16.0 amps of current while depositing metallic film at the third fixed radius. In some embodiments, the top outer magnet and the top inner magnet are supplied with about 14.0 amps to about 18.0 amps of current while depositing metallic film at the third fixed radius. In some embodiments, the bottom inner magnet is supplied with about negative 14.0 amps to about negative 18.0 amps of current while depositing metallic film at the third fixed radius.

At 514, the method 500 includes positioning the magnet assembly to a fourth fixed radius with respect to the central axis by rotating the magnet assembly about the offset axis. In some embodiments, the fourth fixed radius is about 4.5 inches to about 5.5 inches. In some embodiments, the fourth fixed radius is about 4.9 inches to about 5.1 inches.

At 516, the method 500 includes depositing metallic film onto the substrate while rotating the magnet assembly with respect to the central axis at the fourth fixed radius over a fourth period of time. In some embodiments, the fourth period of time is similar to at least one of the first period of time, the second period of time, or the third period of time. In some embodiments, the fourth period of time is different than each of the first period of time, the second period of time, and the third period of time. In some embodiments, a rate of deposition of the metallic film onto the substrate while rotating the magnet assembly at the fourth fixed radius is about 115 to about 135 angstroms per second. In some embodiments, an RF bias power at a frequency of about 2.1 kW to about 2.3 kW is applied to a substrate support assembly of the PVD chamber while depositing metallic film at the fourth fixed radius.

In some embodiments, the upper magnet assembly is supplied with about 10.0 amps to about 14.0 amps of current while depositing metallic film at the fourth fixed radius. In some embodiments, the top outer magnet and the top inner magnet are supplied with about 14.0 amps to about 18.0 amps of current while depositing metallic film at the fourth fixed radius. In some embodiments, the bottom inner magnet is supplied with about negative 14.0 amps to about negative 18.0 amps of current while depositing metallic film at the fourth fixed radius.

At 518, the method 500 includes positioning the magnet assembly to a fifth fixed radius with respect to the central axis by rotating the magnet assembly about the offset axis. In some embodiments, the fifth fixed radius is about 5.9 inches to about 7.5 inches. In some embodiments, the fifth fixed radius is about 6.0 inches to about 6.7 inches.

At 520, the method 500 includes depositing metallic film onto the substrate while rotating the magnet assembly with respect to the central axis at the fifth fixed radius over a fifth period of time. In some embodiments, the fifth period of time is similar to at least one of the first period of time, the second period of time, the third period of time, or the fourth period of time. In some embodiments, the fifth period of time is different than each of the first period of time, the second period of time, the third period of time, and the fourth period of time. In some embodiments, a rate of deposition of the metallic film onto the substrate while rotating the magnet assembly at the fifth fixed radius is about 80 to about 100 angstroms per second. In some embodiments, an RF bias power at a frequency of about 2.1 kW to about 2.3 kW is applied to a substrate support assembly of the PVD chamber while depositing metallic film at the fifth fixed radius.

In some embodiments, the upper magnet assembly is supplied with about 5.0 amps to about 9.0 amps of current while depositing metallic film at the fifth fixed radius. In some embodiments, the top outer magnet and the top inner magnet are supplied with about 10.0 amps to about 14.0 amps of current while depositing metallic film at the fifth fixed radius. In some embodiments, the bottom inner magnet is supplied with about negative 10.0 amps to about negative 14.0 amps of current while depositing metallic film at the fifth fixed radius.

The metallic film may be deposited onto the substrate at the five radii in any order. For example, in some embodiments, the metallic film is deposited onto the substrate at the first fixed radius, then the second fixed radius, then the third fixed radius, then the fourth fixed radius, then the fifth fixed radius. In some embodiments, the metallic film is deposited onto the substrate at the fifth fixed radius, then the fourth fixed radius, then the third fixed radius, then the second fixed radius, then the first fixed radius. In some embodiments, a rate of deposition of the metallic film onto the substrate is greater when the magnet assembly is at the first fixed radius than when at the fifth position.

While the foregoing is directed to embodiments of the present disclosure, other and further embodiments of the disclosure may be devised without departing from the basic scope thereof.

The invention claimed is:

1. A magnetron assembly for use in a PVD chamber, comprising:
   a base plate having a first side, a second side opposite the first side, and a central axis;
   a magnet plate rotatably coupled to the base plate on the first side of the base plate, wherein the magnet plate rotates with respect to the base plate about an offset axis;
   a magnet assembly coupled to the magnet plate offset from the offset axis and configured to rotate about the central axis and the offset axis, wherein all magnets of the magnetron assembly are fixedly coupled to the magnet plate;

a first motor coupled to the base plate to rotate the magnet assembly about the central axis; and a second motor coupled to the magnet plate to control an angular position thereof and to position the magnet assembly in each of a plurality of fixed angular positions defining a plurality of different fixed radii, wherein the magnet assembly is configured to rotate 360 degrees about the central axis at each of the plurality of fixed radii.

2. The magnetron assembly of claim 1, wherein the magnet assembly is configured to rotate about 180 degrees from a zero degree position about the offset axis to position the magnet assembly at each of the plurality of different fixed radii.

3. The magnetron assembly of claim 1, further comprising a counterweight coupled to the base plate opposite the magnet plate about the central axis.

4. The magnetron assembly of claim 1, further comprising a counterweight coupled to the magnet plate on a side opposite the magnet assembly about the offset axis.

5. The magnetron assembly of claim 1, wherein the plurality of different fixed radii includes a first fixed radius of about 1.5 inches to about 2.6 inches, a second fixed radius of about 2.6 inches to about 3.5 inches, a third fixed radius of about 3.5 inches to about 4.5 inches, a fourth fixed radius of about 4.5 inches to about 5.5 inches, and a fifth fixed radius of about 5.9 inches to about 7.5 inches.

6. The magnetron assembly of claim 1, wherein when the magnet assembly is disposed about 180 degrees from a position sensor with respect to the offset axis, and wherein the magnet assembly is disposed at a first fixed radius corresponding with a radially innermost position of the magnet assembly with respect to the central axis.

7. The magnetron assembly of claim 1, wherein a distance between the central axis and the offset axis is about 4.0 inches to about 5.0 inches.

8. The magnetron assembly of claim 1, wherein a distance between the offset axis and a center of the magnetic assembly is about 2.0 inches to about 3.0 inches.

9. A method of depositing metallic film on a substrate, comprising:
positioning a magnet assembly in a physical vapor deposition (PVD) chamber at a first fixed radius with respect to a central axis of a target;
depositing metallic film onto the substrate disposed opposite the target in the PVD chamber while rotating the magnet assembly with respect to the central axis at the first fixed radius for a first period of time;
positioning the magnet assembly at a second fixed radius with respect to the central axis by rotating the magnet assembly about an offset axis; and
depositing metallic film onto the substrate while rotating the magnet assembly with respect to the central axis at the second fixed radius for a second period of time.

10. The method of claim 9, further comprising:
positioning the magnet assembly at a third fixed radius with respect to the central axis by rotating the magnet assembly about the offset axis;
depositing metallic film onto the substrate while rotating the magnet assembly with respect to the central axis at the third fixed radius for a third period of time;
positioning the magnet assembly at a fourth fixed radius with respect to the central axis by rotating the magnet assembly about the offset axis;
depositing metallic film onto the substrate while rotating the magnet assembly with respect to the central axis at the fourth fixed radius for a fourth period of time;
positioning the magnet assembly at a fifth fixed radius with respect to the central axis by rotating the magnet assembly about the offset axis; and
depositing metallic film onto the substrate while rotating the magnet assembly with respect to the central axis at the fifth fixed radius for a fifth period of time.

11. The method of claim 10, wherein the metallic film is deposited onto the substrate at the first fixed radius, then the second fixed radius, then the third fixed radius, then the fourth fixed radius, then the fifth fixed radius.

12. The method of claim 10, wherein the first fixed radius is about 1.5 inches to about 2.6 inches, wherein the second fixed radius is about 2.6 inches to about 3.5 inches, wherein the third fixed radius is about 3.5 inches to about 4.5 inches, wherein the fourth fixed radius is about 4.5 inches to about 5.5 inches, and the fifth fixed radius is about 5.9 inches to about 7.5 inches.

13. The method of claim 9, further comprising at least one of:
applying an RF bias power at a frequency of about 2.0 kW to about 2.2 kW to a substrate support assembly of the PVD chamber while depositing metallic film at the first fixed radius, or
supplying an upper magnet assembly disposed about a chamber body of the PVD chamber with about 6.0 amps to about 16.0 amps of current while depositing metallic film at the first fixed radius and the second fixed radius.

14. The method of claim 9, wherein the magnet assembly rotates 360 degrees about the central axis at each of the first fixed radius and the second fixed radius.

15. A non-transitory computer readable medium for storing computer instructions that, when executed by at least one processor causes the at least one processor to perform a method comprising:
positioning a magnet assembly in a physical vapor deposition (PVD) chamber at a first fixed radius with respect to a central axis of a target;
depositing metallic film onto a substrate disposed opposite the target in the PVD chamber while rotating the magnet assembly with respect to the central axis at the first fixed radius for a first period of time;
positioning the magnet assembly at a second fixed radius with respect to the central axis by rotating the magnet assembly about an offset axis; and
depositing metallic film onto the substrate while rotating the magnet assembly with respect to the central axis at the second fixed radius for a second period of time.

16. The method of claim 15, further comprising:
positioning the magnet assembly at a third fixed radius with respect to the central axis by rotating the magnet assembly about the offset axis;
depositing metallic film onto the substrate while rotating the magnet assembly with respect to the central axis at the third fixed radius for a third period of time;
positioning the magnet assembly at a fourth fixed radius with respect to the central axis by rotating the magnet assembly about the offset axis;
depositing metallic film onto the substrate while rotating the magnet assembly with respect to the central axis at the fourth fixed radius for a fourth period of time;
positioning the magnet assembly at a fifth fixed radius with respect to the central axis by rotating the magnet assembly about the offset axis; and
depositing metallic film onto the substrate while rotating the magnet assembly with respect to the central axis at the fifth fixed radius for a fifth period of time.

17. The method of claim 16, wherein the metallic film is deposited onto the substrate at the first fixed radius, then the second fixed radius, then the third fixed radius, then the fourth fixed radius, then the fifth fixed radius.

18. The method of claim 16, wherein the first fixed radius is about 1.5 inches to about 2.6 inches, wherein the second fixed radius is about 2.6 inches to about 3.5 inches, wherein the third fixed radius is about 3.5 inches to about 4.5 inches, wherein the fourth fixed radius is about 4.5 inches to about 5.5 inches, and the fifth fixed radius is about 5.9 inches to about 7.5 inches.

19. The method of claim 15, further comprising at least one of:
  applying an RF bias power at a frequency of about 2.0 kW to about 2.2 kW to a substrate support assembly of the PVD chamber while depositing metallic film at the first fixed radius, or
  supplying an upper magnet assembly disposed about a chamber body of the PVD chamber with about 6.0 amps to about 16.0 amps of current while depositing metallic film at the first fixed radius and the second fixed radius.

20. The method of claim 15, wherein the magnet assembly rotates 360 degrees about the central axis at each of the first fixed radius and the second fixed radius.

* * * * *